6/23/87 XR 4,675,624

United States Patent [19]

Rosen et al.

[11] Patent Number: 4,675,624

[45] Date of Patent: Jun. 23, 1987

[54] ELECTRICAL PHASE SHIFTER CONTROLLED BY LIGHT

[75] Inventors: Arye Rosen, Camden County, N.J.; Peter R. Herczfeld, Philadelphia, Pa.

[73] Assignees: RCA Corporation, Princeton, N.J.; Drexel University, Philadelphia, Pa.

[21] Appl. No.: 717,850

[22] Filed: Mar. 29, 1985

[51] Int. Cl.⁴ ..................... H01P 1/185; H01L 31/16; G02B 6/12

[52] U.S. Cl. .................................... 333/161; 333/164; 333/247; 350/96.11; 357/14; 357/30

[58] Field of Search ............... 333/161, 156, 164, 262, 333/246, 247, 150-155, 193-196; 307/311, 320; 332/30 R, 30 V; 357/29, 26, 30, 14; 315/96.12, 96.11, 96.1, 96.15

[56] References Cited

U.S. PATENT DOCUMENTS

| | | | |
|---|---|---|---|
| 3,560,891 | 2/1971 | MacLeay et al. | 333/161 |
| 3,917,943 | 11/1975 | Auston | 357/29 X |
| 4,231,049 | 10/1980 | Pearsall | 357/30 X |
| 4,281,253 | 7/1981 | Culver | 350/96.16 |
| 4,326,771 | 4/1982 | Henry et al. | 350/96.15 |
| 4,368,481 | 1/1983 | Obashi et al. | 357/30 |
| 4,376,285 | 3/1983 | Leonberger et al. | 357/30 X |
| 4,388,633 | 6/1983 | Vasudev | 357/17 |
| 4,396,833 | 8/1983 | Pan | 357/30 X |
| 4,399,453 | 8/1983 | Berg et al. | 357/30 X |

OTHER PUBLICATIONS

Article entitled: "Optically Controlled Microwave PIN Diode Phase Shifter and Gunn Oscillator" by: Peter Robert Herczfeld et al., published: 1985 IEEE Princeton Section Sarnoff Symposium Digest.

Article entitled "Optical Control of Millimeter-Wave Propagation in Dielectric Waveguides" by: Lee et al., published in IEEE Journal of Quanttun Electronics vol. QE-16, No. 3, dated Mar. 1980.

*Primary Examiner*—T. H. Tubbesing
*Assistant Examiner*—Gilberto Barrón, Jr.
*Attorney, Agent, or Firm*—Joseph S. Tripoli; William H. Meise; Henry I. Steckler

[57] ABSTRACT

A TEM-mode transmission line such as a microstrip or coplanar line includes a pair of conductors, at least one of which is elongated. A semiconductor junction or junctions are coupled across the conductors. If a single junction is used, the junction may be laterally elongated or distributed. If discrete semiconductor junction devices are used, plural devices may be coupled across the transmission line. The capacitance of the junction(s) controls the phase shift imparted by the transmission lines to AC signals traversing the line. The capacitance of the semiconductor junctions in controlled by light coupled into the junction region. The light is coupled to the junction region by fiber-optic cables or by means of light illuminating the junction.

30 Claims, 26 Drawing Figures

ELECTRICAL PHASE SHIFTER CONTROLLED BY LIGHT

This invention relates to electrical phase shifters such as for radio frequency electromagnetic signals which are controlled by light signals.

Many modern radar systems and other high frequency communications systems use scanning array antennas rather than bulky, expensive and slow scanning mechanical reflectors. The scanning array antenna consists of a number of closely spaced small antennas driven from (or driving, these being duals) a common source. Steering of the resulting beam from the antenna array is accomplished by controlling the phase of the signals applied to each of the elements of the array relative to the other elements. If only on-axis radiation is required, then phase shifters are ordinarily not required. However, if the beam is to be scanned or moved in space relative to the boresight axis of the array, then variable or controllable phase shifters must be provided. Simple controllable phase shifters can be implemented by the use of different lengths of transmission line which are switched into or out of the transmission path to add a delay corresponding to the propagation delay of the length of transmission line so switched. Such systems are somewhat difficult to implement, because the simplest electronically controlled type of phase shifter requires switching diodes series connected with the transmission line. The biasing of such series connected diodes requires series connected capacitors to prevent the controlling bias signal applied to one diode from affecting the diode associated with the next transmission line section. The series diodes and coupling capacitors are costly and introduce losses.

In addition to the series diode types of phase shifters, other switching phase shifters are known which switch lengths of shunt transmission line into circuit with the main transmission line path, as described for example in U.S. Pat. No. 4,275,367, issued June 23, 1981 to Gaglione et al. A major disadvantage of the switched transmission line type of phase shifter is the finite number of values of phase shift which can be achieved. Without infinitely variable control, scanning of the beam of an antenna cannot be accomplished in a smooth and continuous manner.

It is also known that transmission lines loaded with ferrite or other magnetic material are used as phase shifters. The magnetic properties are changed by control windings in order to change the effective series inductance of the transmission line and thereby change the phase shift. Such ferrite phase shifters are reliable and capable of handling high power, but are bulky and may be slow to slew, due to the inductance of the control winding which retards the rise time of a control signal. A large amount of assembly is required to fabricate ferrite phase shifters and they are therefore expensive and they may therefore also be variable from unit to unit. The electrical control signal may be disadvantageous for vehicular applications such as airborne or shipborne systems because of the large numbers of bulky control cables which must the routed through the vehicle in order to control the many elements of the phased array antenna, because of the shielding which must be associated with each control conductor to prevent undesired radiation of control signals which might interfere with other systems, and also to prevent undesired interaction between the control signals applied to one conductor and other conductors to which different control signals are applied.

It is known that the phase shift of two conductor transmission lines such as twin-lead, coax and micro-strip (all of which are normally operated in the TEM mode) can be controlled. It is known to make phase-shifter structures by coupling diodes across the conductors of a transmission line at points periodically spaced along the line and to bias the diodes into a capacitive mode, wherein the amount of capacitance selected by the bias establishes the delay of the transmission line and thereby establishes the phase shift. Such structures are advantageous for vehicular use because of their small size and light weight. These phase shifters are particularly advantageous by comparison with the ferrite types because of the relatively small magnitude of the control voltage required for achieving a desired phase-shift. However, for vehicular applications this low voltage exacerbates the problem of shielding of the control cables, because the phase-shifter operation may be perturbed by relatively small amounts of interfering signal in the region of the vehicle. Also, the control signal is smaller in magnitude relative to the power being phase-shifted, and coupling onto the control lines of the signals being controlled is more possible.

It is known to phase shift electromagnetic waves propagating in a rectangular semiconductor waveguide by use of a light beam to generate a plasma which controls the phase shift, as described in "Optical Control of Millimeter-Wave Propagation in Dielectric Waveguides" by Lee et al, published in Journal of Quantum Electronics, Volume QE-16, No. 3 March 1980. The phase shift in such an arrangement occurs over a narrow range of plasma densities at which the effective guide width is doubled due to imaging of the guide by the near metallic nature of the plasma. Unfortunately, control of the loss vs phase shift is very critical. It would be desirable to have a phase shifter for electrical signals which is controllable by optical means and which has low loss.

SUMMARY OF THE INVENTION

A light controlled phase shifter includes a transmission line which includes first and second elongated separated conductors defining a structure having at least a distributed series inductance associated with the first and second conductors and which also defines an input port and an output port. At least one semiconductor junction having a capacitance associated with the junction is coupled to the transmission line for coupling the capacitance across the first and second conductors. An alternating current electrical (electromagnetic) signal is coupled to the input port whereby they may propagate through the transmission line to the output port, at which they appear as delayed electrical signals. A light control arrangement is positioned relative to the semiconductor junction for selective light illumination thereof for control of the capacitance whereby the delayed electrical signal is controllably delayed.

DESCRIPTION OF THE DRAWING

FIG. 7 illustrates as b the fields associated with coplanar transmission line formed by a structure corresponding to those of FIG. 6;

DESCRIPTION OF THE DRAWING

Figure 1:
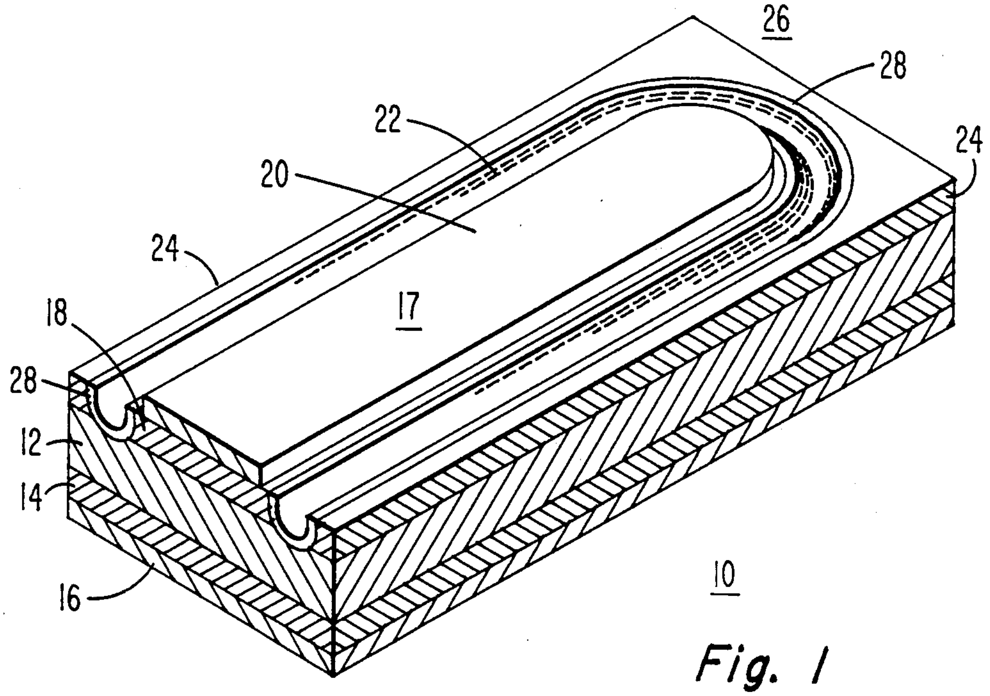
FIG. 1 illustrates in isometric view a section of a distributed phase shifter aiding in understanding the invention.

FIG. 1 illustrates a section of a monolithic structure (monolith or monolithic chip) designated generally as 10 which includes a layer 12 of intrinsic semiconductor such as silicon which overlies a layer 14 of n+ silicon material, which may be for example semiconductor material doped with an excess of Phosphorus atoms. A layer 16 of deposited metal overlies the side of layer 14 remote from intrinsic layer 12. A layer of semiconductor material doped with an excess of Boron atoms (a p+ region) overlies intrinsic region 12. This layer includes an elongated portion 18. A strip metallization 20 overlies substantially the entirety of p+ portion 18. Semiconductor portion 18 is separated from that portion 24 of the p+ region overlying intrinsic layer 12 by a moat 22 completely surrounding p+ portion 18 and having a depth sufficient to penetrate completely through the p+ layer into the intrinsic layer. That portion of the p+ layer lying outside the moat is designated as 24. Moat 22 defines an elongated strip conductor designated as 17 which includes conductive p+ portion 18 and strip metallization 20. One end designated generally as 26 of strip conductor 17 is illustrated in FIG. 1. Moat 22 is passivated by a layer 28 of silicon dioxide ($S_iO_2$).

Figure 2:
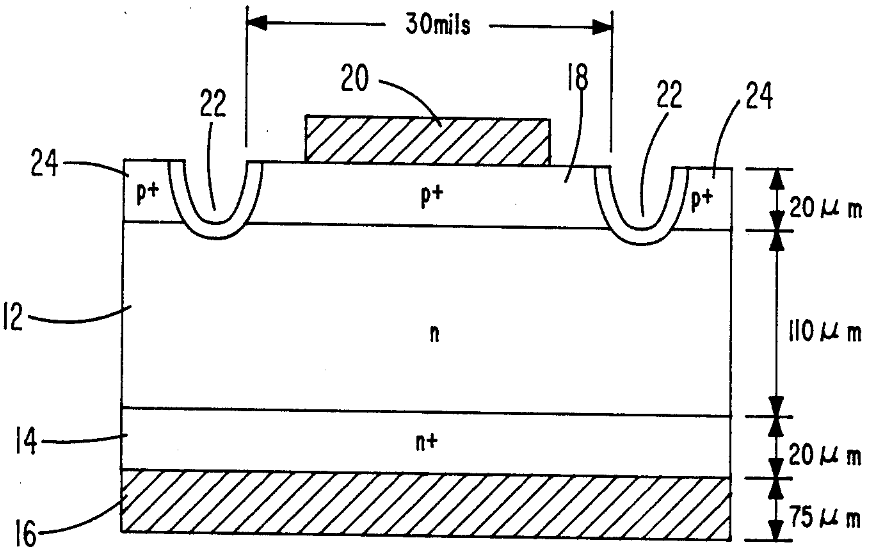
FIG. 2 is an end view of the structure illustrated in FIG. 1.
Figure 3:
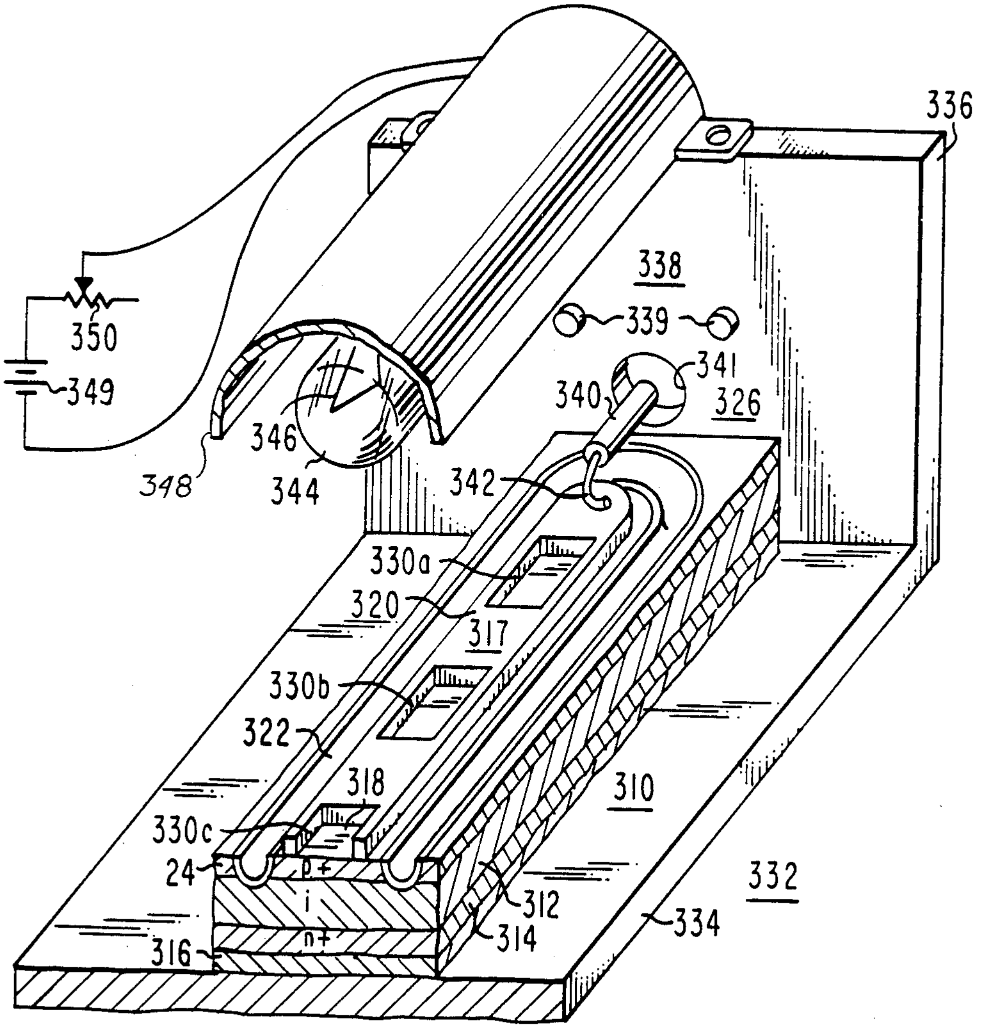
FIG. 3 illustrates a section of a phase shifter in accordance with the invention.

FIG. 2 illustrates an end view of the structure illustrated in FIG. 1, together with some representative dimensions. The structure defines a vertically-doped PIN diode. FIG. 3 illustrates a light-controlled phase-shifter according to the invention. In FIG. 3, elements corresponding to those illustrated in FIGS. 1 and 2 are designated by the same reference numbers in the 300 series. In FIG. 3, monolith 310 is identical to monolith 10 except in one regard. In FIG. 3, strip metallization 317 overlying p+ layer 318 is fenestrated (contains one or more windows). The windows or fenestrations in upper metallization 320 are rectangular and are designated 330a, 330b and 330c . . . Monolith 310 is mounted on a support designated generally as 332 including a bottom plate 334 onto which bottom metallization 316 of monolith 310 is affixed. Support 332 also includes an upright portion 336 immediately adjacent to end 326 of monolith 310. A coaxial panel connector or coax-to-microstrip adapter designated generally as 338 is mounted through appropriate apertures in upright 336. Connector mounting screws 339 and protruding center-conductor pin 340 extend through upright plate 336 in the region of the end 326 of monolith 310. The pin 340 passes in insulative manner through aperture 341 in plate 336. A bonding wire 342 is bonded as by soldering, brazing or welding to pin 340 and to the end of fenestrated metallization 320. The structure so far defined constitutes a transmission line similar to a microstrip line in which conductive strip 317 is the strip conductor, with which a distributed series inductance is principally associated. Conductive n+ region 314 and conductor 316 together constitute a conductive ground plane of the microstrip transmission line, and are hereafter referred to as "ground". The distributed shunt capacitance of the transmission line is principally associated with the PIN junction region between strip conductor 317 and ground. Radio-frequency (RF) or other electromagnetic signals (alternating-current electrical signals in the most general sense) applied by way of coaxial connector 338 between the end of conductive strip 317 and ground propagate along the length of the structure to the other end (not illustrated in FIG. 3) with a delay or phase shift associated with the distributed series inductance and shunt capacitance. In accordance with the invention, control of the phase shift is provided by a source of illumination illustrated as a lamp 344 having an elongated filament 346. Lamp 344 is energized by current from a battery illustrated schematically as 348.

The current provided to filament 346 is controlled by a rheostat 350 in a known fashion. Light from filament 346 illuminates monolith 310 generally. Metallization layer 320 tends to block light from the junction, although some light can reach the junction by way of moat 322. Windows 330*a*, 330*b* . . . provide pathways by which a substantial portion of the illumination may fall upon the PIN junction in order to affect the capacitance and thereby control the phase shift.

Figure 4:
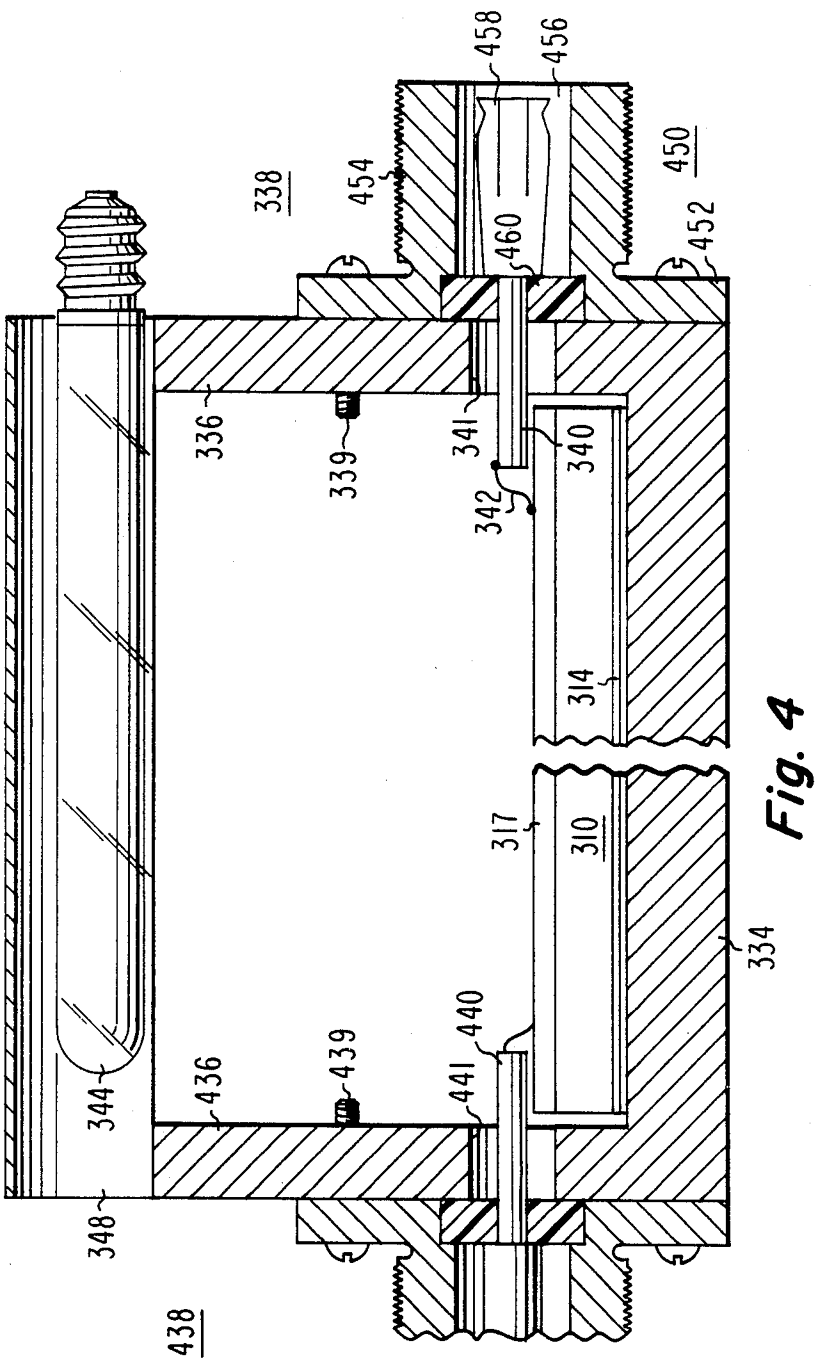
FIG. 4 illustrates in cross-sectional side view a portion of the structure illustrated in FIG. 3.

FIG. 4 illustrates details of the mounting arrangement of FIG. 3. In FIG. 4, monolith 310 is located between upright 336 and a second upright 436, and upright 436 includes an aperture 441 through which a center-conductor pin extension 440 extends from a second coaxial panel connector 438. Since connectors 338 and 438 are identical, only connector 338 is described in detail. Connector 338 includes a body designated generally as 450 including a flange 452 continuous with a portion 454 of a connector body outside-threaded for a mating connector (not illustrated). Portion 454 includes a bore 456 in which female center conductor section 458 is centered. Center conductor section 458 is an extension of pin 340, both of which are supported by a dielectric washer 460.

Figure 5:
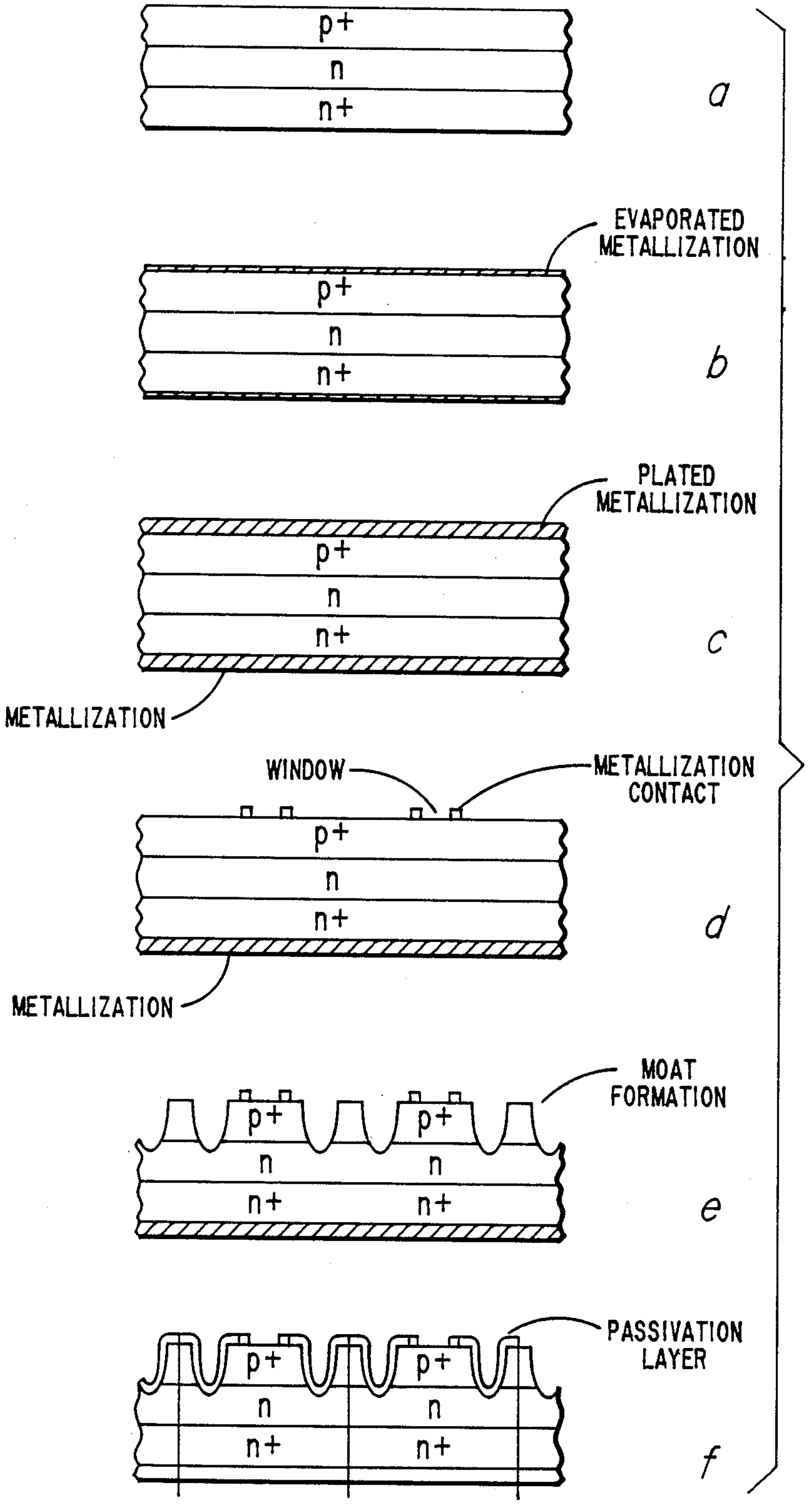
FIG. 5 illustrates various steps in the fabrication of the semiconductor structure illustrated in FIGS. 1 through 3.

FIGS. 5*a*–5*f* illustrate steps in the forming of vertically doped monolith 310. In FIG. 5*a*, a region designated n which is substantially intrinsic may, as known, be doped slightly, and excess Phosphorus and Boron atoms are applied from either side to produce n+ and p+ layers, respectively. FIG. 5*b* illustrates the result of application of evaporated metallization to both sides, and FIG. 5*c* illustrates a thicker plated metallization. The metallization is masked to define metallization contacts and windows, and is etched to produce a structure illustrated in FIG. 5*d*. FIG. 5*e* illustrates etching to produce the moat, and FIG. 5*f* illustrates the application of a passivation layer to the moat. The structure may be cut into sections along the lines as indicated or several diodes may be provided on a single substrate so as to be assured of having a good diode available when the device is mounted.

A thin layer of tin is transparent. The need for windows may be eliminated, and a monolith such as 10 of FIG. 1 may be used in an arrangement such as that of FIGS. 3 and 4 without the need for windows, if conductive layer 20 is a thin, transparent layer of tin.

Figure 6A:
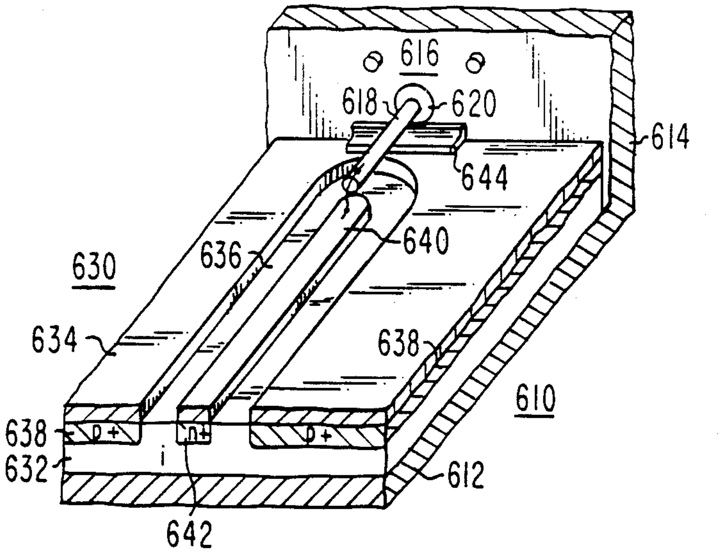
FIGS. 6a and 6b illustrate sections of structures which may be used in alternative embodiments of the invention.

FIG. 6*a* illustrates an alternative embodiment of a distributed PIN phase shifter in accordance with the invention. In the alternative embodiment of FIG. 6*a*, the distributed PIN diode is doped laterally rather than vertically, as in the arrangement of FIG. 3. In FIG. 6*a*, a mounting bracket designated generally as 610 includes a bottom plate 612 and an upright plate 614 upon which is mounted a coaxal connector designated generally as 616, the center-conductor pin extension 618 of which protrudes through an aperture 620. A monolithic chip designated generally as 630 includes a layer 632 of intrinsic semiconductor material. A ground metallization 634 overlies the entirety of monolith 630 except for an elongated aperture 636. Between ground metallization 634 and intrinsic layer 632 is a p+ doped layer 638 of semiconductor material. Within elongated aperture 636 is an elongated strip metallization 640 which overlies an n+ doped region 642. A bracket 644 is connected to upright plate 614 and to the upper surface of ground metallization 634 to provide ground continuity between ground metallization 634 and upright 614 in the region near connector 616.

Figure 6B:
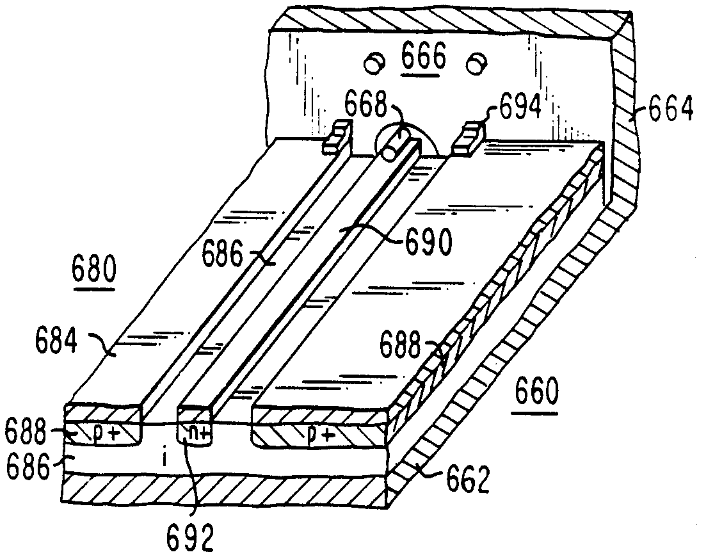

The alternative embodiment of FIG. 6*b* is similar to that of FIG. 6*a*, except that the strip conductor 690 extends all the way to and under pin 668 of connector 666. Pin 668 is mounted at a height which allows direct soldering to strip conductor 690, thereby providing a less reactive transition from microstrip to coax than in FIG. 6*a*. A pair of brackets 694 are each electrically coupled to upright wall 664 and to one of separate ground planes 684.

Figure 7:
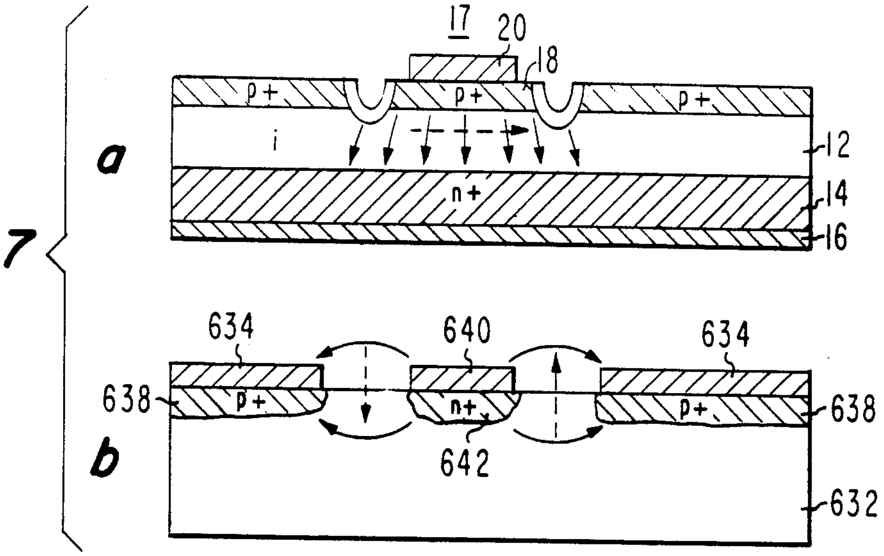
FIG. 7 illustrates as a the electric fields associated with transmission of alternating electrical signals through a microstrip-like transmission line formed by a structure corresponding to that of FIGS. 1-5.

FIG. 7*a* illustrates with solid lines the instantaneous electric field configuration between strip conductor 17 and the combination of ground metallization 16 and conductive n+ layer 14. The instanteous magnetic field corresponding to the illustrated electric field configuration is shown as a dotted line. The equivalence of the structure to a microstrip line is apparent. FIG. 7*b* illustrates the instantaneous electric and magnetic field configuration for a coplanar transmission line structure such as that illustrated in FIG. 6. As can be seen, the electric field is bifurcated, with each half originating on the combination of conductor 640 and n+ region 642 and terminating on the combination of ground conductor 634 and conductive region 638. The corresponding magnetic field structure is illustrated by dotted line arrows. Both of these transmission lines operate in a TEM mode, have series inductance associated with the incremental length of the conductors and a capacitance associated with the semiconductor junction, whether vertical or lateral. It should be noted that the groundplane (14, 16) associated with the microstrip structure of FIG. 7*a* and the ground plane (634, 638) of FIG. 7*b* are illustrated as being truncated. Because of the field structures of such transmission lines, those portions of the ground plane far from the strip conductor contribute little to the transmission, and may therefore be disregarded. In a transmission line including a large ground plane separated from a strip conductor, the effective ground plane is that portion lying under the strip conductor and lying in a region within two or three separation distances on either side. Thus, the effective groundplane follows the strip conductor and is also elongated. The actual extent of the physical ground plane is not too important, so long as it covers the region mentioned above.

Figure 8:
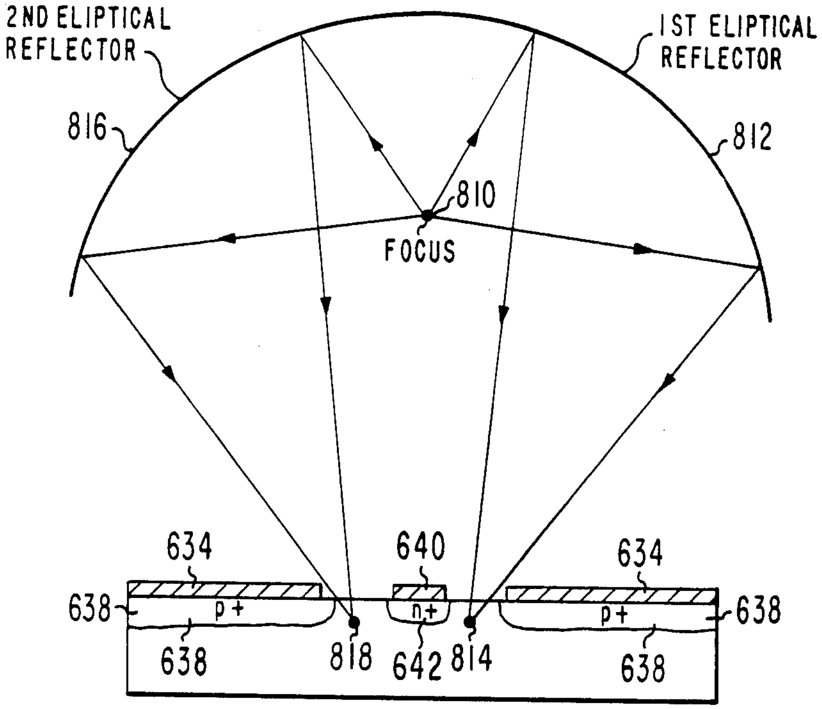
FIG. 8 illustrates the structure of FIG. 6 controlled by light to form a phase-shifter according to an embodiment of the invention.

FIG. 8 is an end view of phase shifter 610 of FIG. 6 together with a representation of the light control arrangement. In FIG. 8, a line light source (not shown) extends along line focus 810 (perpendicular to the plane of the FIGURE). A first elliptical reflector section 812 has foci at focus 810 and along a line 814 (seen in end view) lying within one side of the PIN junction of the illustrated structure. A second elliptical reflector section 816 has foci along line focus 810 and along a line 818 (also seen in end view) lying parallel to strip conductor 640 and within the left side of the PIN junction of the illustrated structure. Such an arrangement uses a light as the control signal source and efficiently couples the light to the light-sensitive portions of the phase shifter for control of phase. The light source lying on or near line focus 810 is controlled in amplitude to control the amount of phase shift, as in the case of FIG. 3.

Figure 9A:
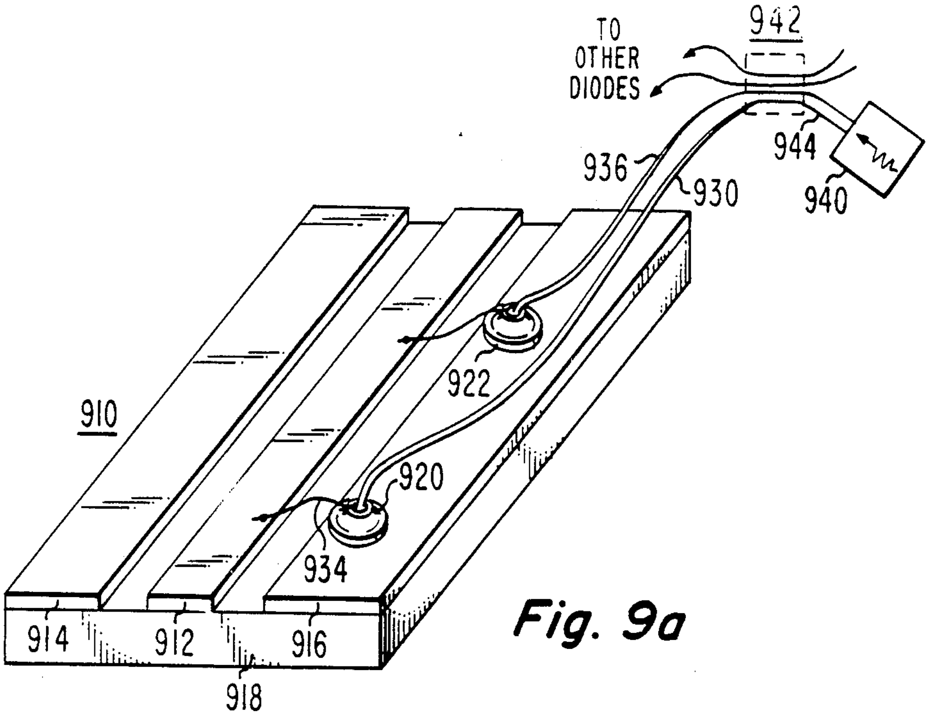
FIGS. 9a and 9b illustrate portions of alternative phase shifters according to the invention, using discrete semiconductor junctions mounted on coplanar and microstrip transmission lines, respectively, with control arrangements including a star coupler and fiber optic cables.
Figure 9E:
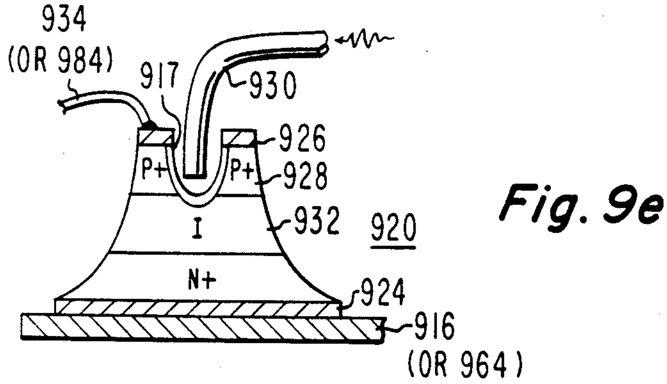
FIG. 9e is a cross-sectional of a discrete PIN junction adaptable for use with fiber-optic control in the structures of FIGS. 9a and 9b.

FIG. 9*a* illustrates a portion of a phase shifter using discrete semiconductor junctions rather than a distributed semiconductor junction. FIG. 9*c* is an end view of the arrangement of FIG. 9*a*. In FIG. 9*a* a coplanar transmission line, a portion of which is designated generally as 910, includes a strip conductor 912 and ground conductors 914 and 916, all deposited on a dielectric substrate 918. Substrate 918 may be a material such as alumina, epoxy-impregnated fiberglass or the like. Several discrete diodes are coupled to coplanar transmission line 12 for loading of the capacitance thereof for control of the phase shift. Diodes 920 and 922 are illustrated. Diodes 920 and 922 are mounted on ground conductor 916 at spaced-apart positions near strip conductor 912. A cross-section of discrete diode 920 is illustrated in FIG. 9*e*. Diode 920 is a vertically doped PIN junction including a bottom metallization 924 which is electrically and mechnically coupled to ground conductor 916 by known techniques, such as reflow soldering. A well 917 is formed in the center of upper metallization 926 which extends into and substantially through p+ region 928. The end of a fiber-optic cable 930 is inserted into the well so that the light applied through fiber optic cable 930 illuminates the junction between p+ region 928 and intrinsic region 932. Fiber-optic cable 930 may be retained in well 917 by known means, such as adhesive or transparent epoxy fill. A bond wire 934 electrically couples top metallization 926 to strip conductor 912. The arrangement of diode 922 is the same, except that its controlling light signals are applied by way of a separate fiber-optic cable 936. In order to provide control from a single light source illustrated as a block 940, an optical star coupler designated generally as 942 is used. Light from source 940 is applied over an input fiber-optic cable 944 to star coupler 942, and the light is split into as many portions as there are output fiber-optic cables (four as illustrated in FIG. 9*a*). Each fiber-optic cable is then coupled to an individual diode as described in conjunction with FIG. 9*e*.

Figure 9B:
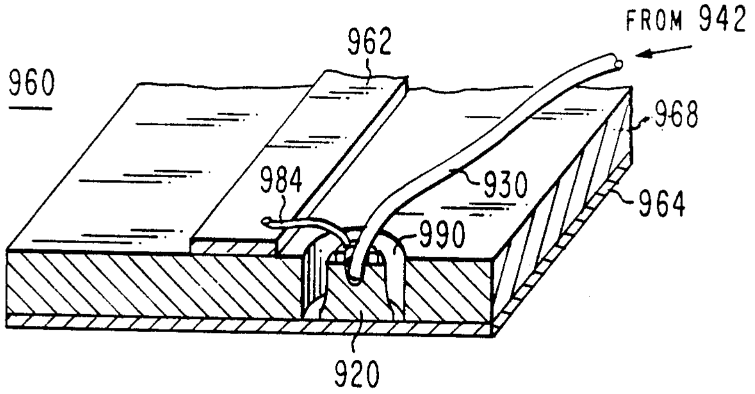
Figure 9C:
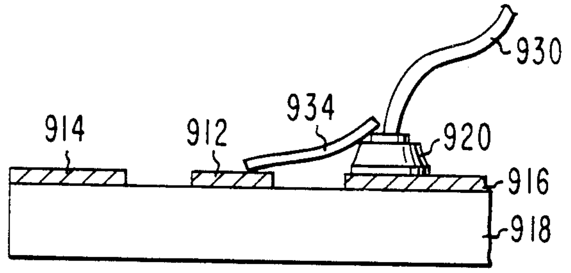
FIGS. 9c and 9d are cross-sectional views of the transmission lines FIG. 9a and 9b, respectively.
Figure 9D:
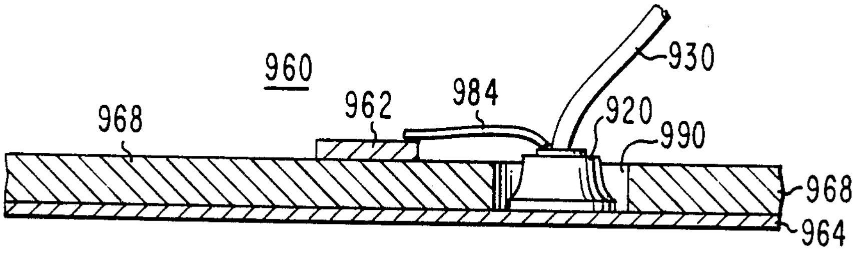

FIGS. 9*b* and 9*d* are views illustrating the use of discrete diodes such as diode 920 for capacitance loading of a microstrip transmission line. In FIGS. 9*b*, and 9*d*, a microstrip transmission line 960 is defined by a strip conductor 962 separated from a ground plane 964 by a dielectric 968. Dielectric plate 968 may be made from alumina, glass-filled epoxy, or other material, and the width of strip 962 relative to the thickness of dielectric 968 will establish the characteristic impedance of the transmission line, taking into account the dielectric constant of the material in a known manner. A clearance hole or aperture 990 in dielectric plate 968 allows diode 920 to be located therein with its bottom metallization 924 in electrical and mechanical contact with ground metallization 964. A bonding conductor 984 couples upper metallization 926 of diode 920 to strip conductor 962. The capacitance of diode 920 is controlled by the illumination applied thereto over fiber-optic cable 930 for control of the capacitive loading of microstrip line 960 and therefore of the phase shift imparted to an AC signal propagating along the transmission line. Although not illustrated in FIGS. 9*b* and 9*d*, more than one diode may be coupled to the line as illustrated in FIG. 9*a*.

Figure 10:
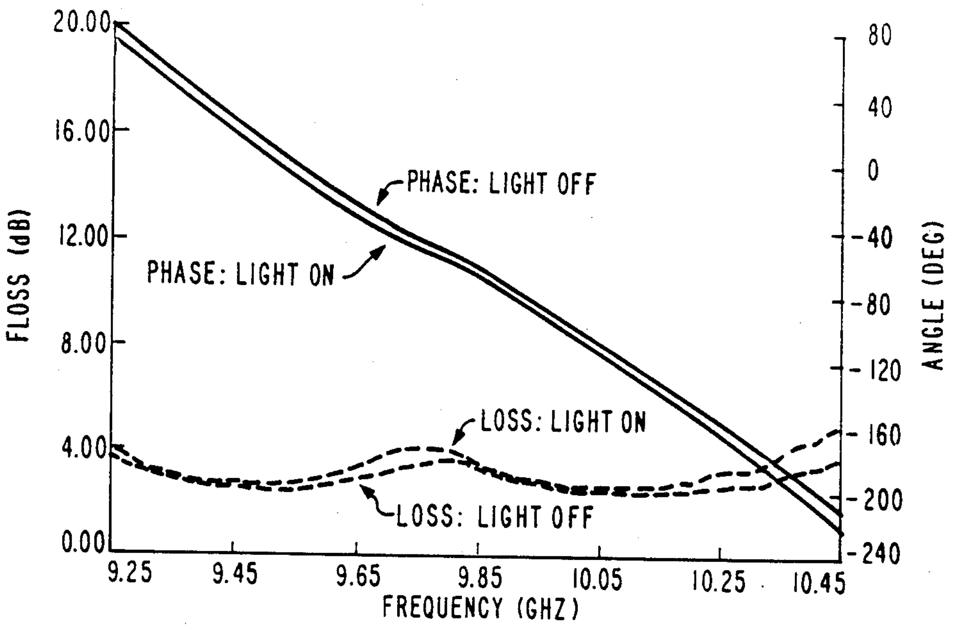
FIG. 10 illustrates plots of phase-shift and through transmission loss over a frequency band for a phase shifter similar to that of FIG. 9 with and without illumination, and FIG. 11 expands a portion thereof.

FIG. 10 illustrates plots of phase-shift versus frequency and through loss versus frequency for a coplanar transmission-line phase shifter as illustrated in FIG. 9*a* and having the following dimensions.

| | | |
|---|---|---|
| width of strip conductor | 0.060" | 1.524 mm |
| length of strip conductor | 2.0" | 50.8 mm |
| separation between strip conductor & ground plane | 0.020" | 0.508 mm |
| number of PIN diodes | 2 | |
| separation between PIN diodes | 1.160" | 29.460 mm |

Figure 11:
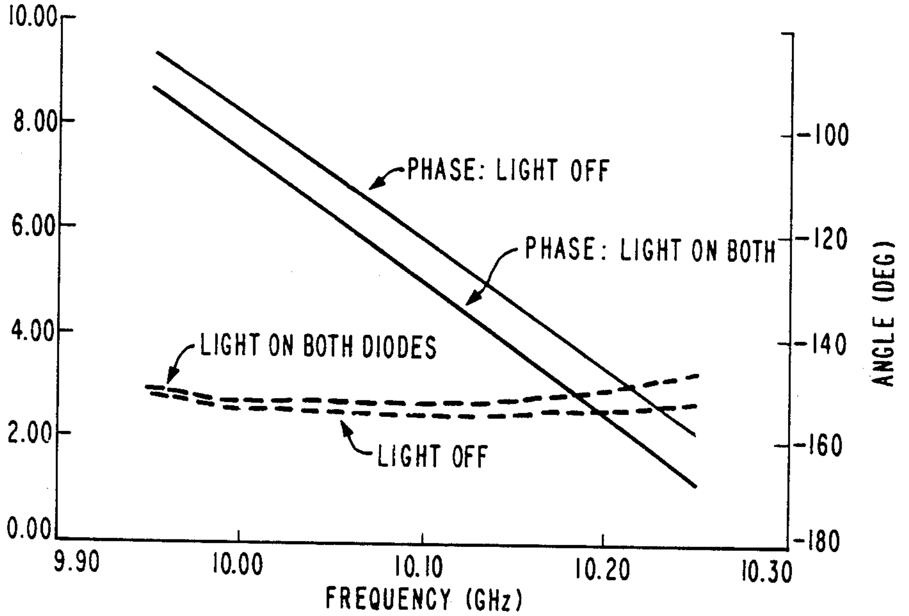

As can be seen, the phase shift and loss are well behaved over the region 9.25 to 10.45 GHz. FIG. 11 is a portion of the plot of FIG. 10 expanded for better visibility.

Figure 12:
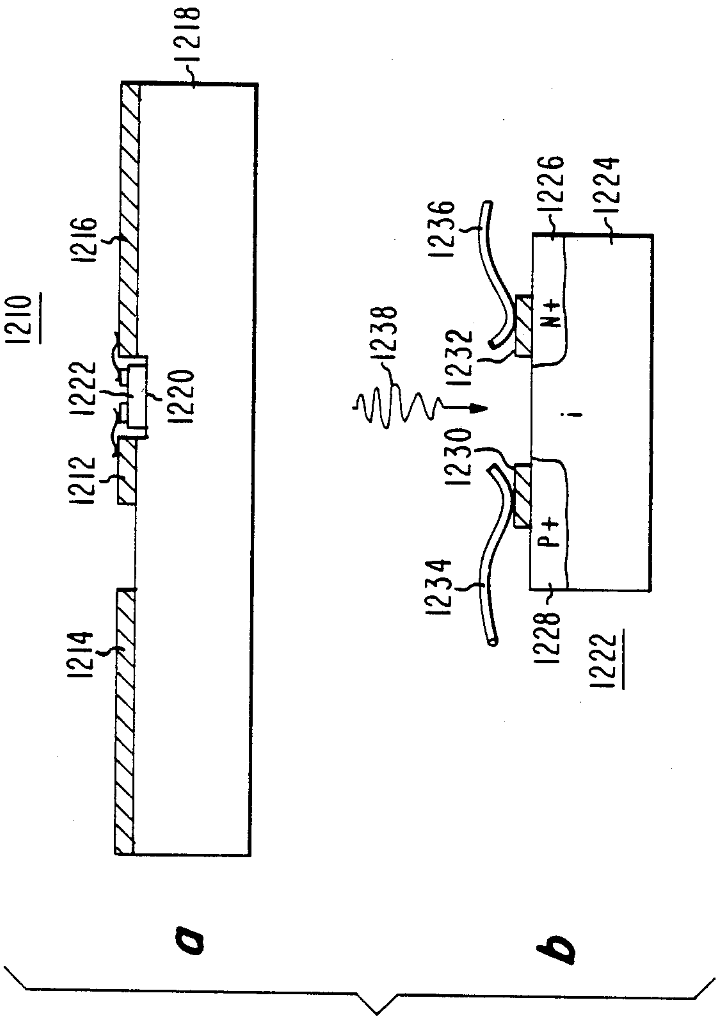
FIG. 12a is a cross-sectional view of a portion of a phase shifter including a lateral PIN function mounted on a coplanar transmission line.
FIG. 12b is a cross-sectional view of the lateral diode.

FIG. 12 illustrates in a cross-sectional end view a portion of a coplanar transmission line 1210 including a strip conductor 1212 and coplanar ground conductors 1214 and 1216 deposited on a dielectric substrate 1218. An aperture or well 1220 has a depth suitable for accepting a lateral PIN diode 1222 illustrated in greater detail in FIG. 12*b*. In FIG. 12*b*, a lateral diode 1222 includes a monolithic semiconductor chip having an intrinsic region 1224 into which n+ regions 1226 and p+ regions 1228 are diffused from the same (upper) side of the chip. A contact metallization 1230 overlies p+ region 1228 and a metallization 1232 overlies n+ region 1226. Bond wires are bonded from metallizations 1230 and 1332 to strip conductor 1212 and ground conductor 1216, respectively. Diode 1222 is responsive to radiation illuminating its junction region from above, as illustrated by symbolic photon 1238.

Figure 13A:
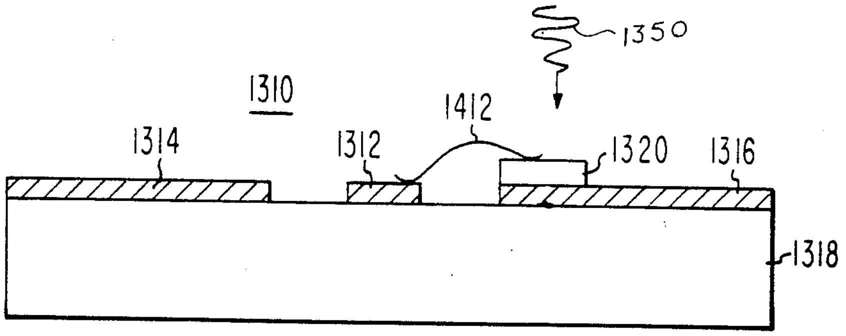
FIG. 13a is a cross-sectional view of a portion of a phase shifter including a coplanar transmission line with capacitive loading on one side provided by a vertically-doped PIN diode arranged for general illumination.
Figure 13B:
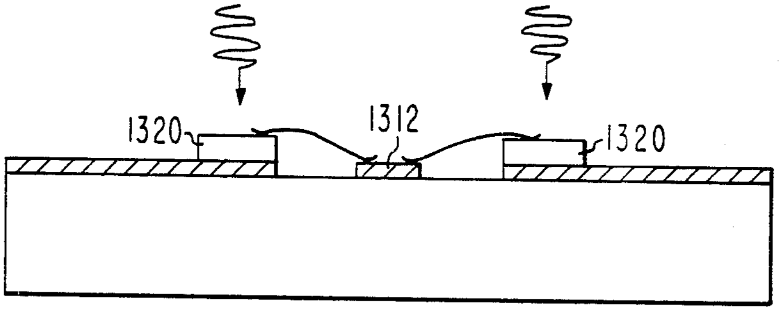
FIG. 13b is a similar line with loading on both sides.
Figure 14A:
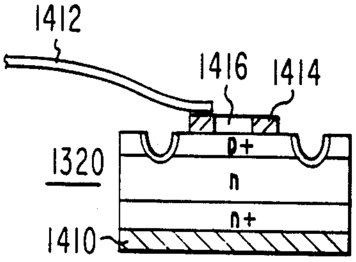
FIGS. 14a and 14b are cross-sectional and isometric views, respectively, of vertical diodes usable in the arrangements of FIGS. 13a and 13b.
Figure 14B:
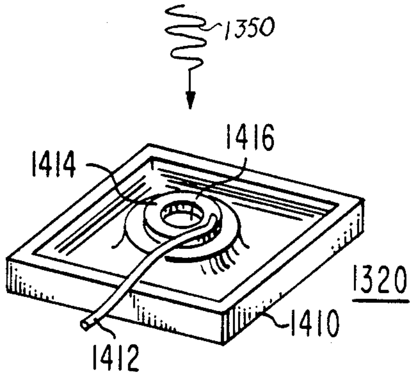

FIG. 13*a* illustrates a coplanar transmission line designated generally as 1310 including a strip conductor 1312 and ground conductors 1314 and 1316 deposited upon a dielectric substrate 1318, in the same manner as in FIGS. 9*a* and 9*c*. A single vertically doped discrete diode 1320 such as is illustrated in FIGS. 14*a* and 14*b* has its ground metallization 1410 electrically bonded to ground conductor 1316 and its upper metallization 1414 coupled by means of bond wire 1412 to strip conductor 1312. FIGS. 14*a* and 14*b* are cross-sectional and perspective views, respectively, of diode 1320. In FIGS. 14*a* and 14*b*, 1410 represents the bottom or ground metallization, 1414 represents the top metallization which defines a window 1416 for receipt of illumination symbolized by 1350, and 1412 is a portion of the bond wire bonded to upper metallization 1414. FIG. 13*b* illustrates the use of diodes 1320 on both sides of strip conductor 1312 for improved symmetry of the transmission line. The positions of diodes 1320 as illustrated in FIG. 13*b* may be staggered along the length dimension (perpendicular to the plane of the FIGURE) to more evenly distribute the capacitive loading.

Figure 15A:
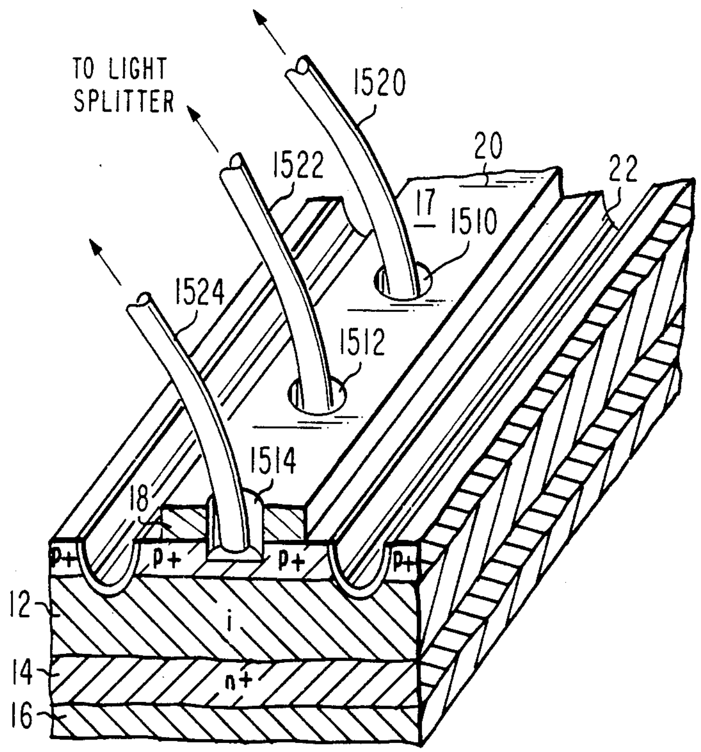
FIG. 15a is a view of a section of a PIN diode transmission line with apertures for control by light from fiber-optic cables and FIG. 15b illustrates a cross-section of the diode with a fiber-optic cable inserted at the bottom.
Figure 15B:
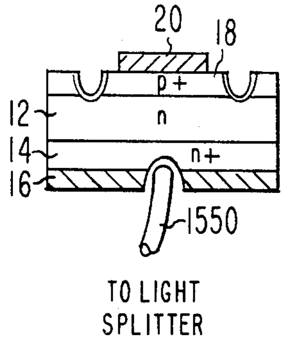

FIG. 15*a* illustrates a portion of a vertically doped distributed PIN junction corresponding generally with the structure illustrated in FIG. 1 in which strip metallization 20 and p+ region 18 define a plurality of apertures or wells 1510, 1512, 1514 . . . into each of which are inserted an end of fiber-optic cables 1520, 1522, 1524 . . . Light is coupled over fiber-optic cables to the region of the junction with less attenuation than by the use of simple windows in upper metallization 20 (FIG. 3). The spacing between wells 1510, 1512, 1514 . . . may be selected to be close enough to provide overlapping regions of light energization, or may be separated as desired. The fiber-optic cables are preferably coupled to a light splitter for energization from a single light source, as in the case of the arrangement of FIG. 9*a*. FIG. 15*b* illustrates a fiber-optic cable entering the diode structure from the bottom.

Figure 16:
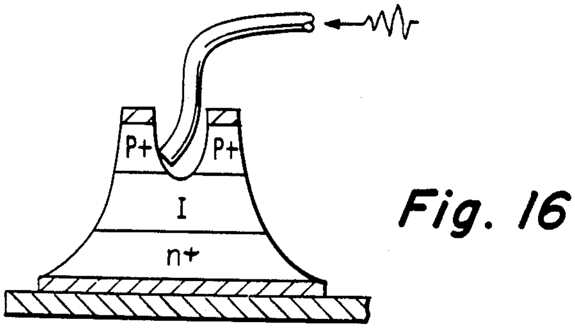
FIG. 16 is a cross-sectional view of PIN diode with fiber-optic cable directing light towards a sensitive portion of the junction.

It has been noticed that the PIN junction appears to be more light-sensitive in the region of the junction between the intrinsic layer and one of the doped layers, such as the p+ layer, than it is in the intrinsic region alone or in the heavily doped layers along. Thus, more phase-shifting effect is obtained for a given amount of light if the fiber-optic cable is oriented as illustrated in FIG. 16, so that the light is directed somewhat sideways into the junction between the intrinsic and doped regions.

Figure 17B:
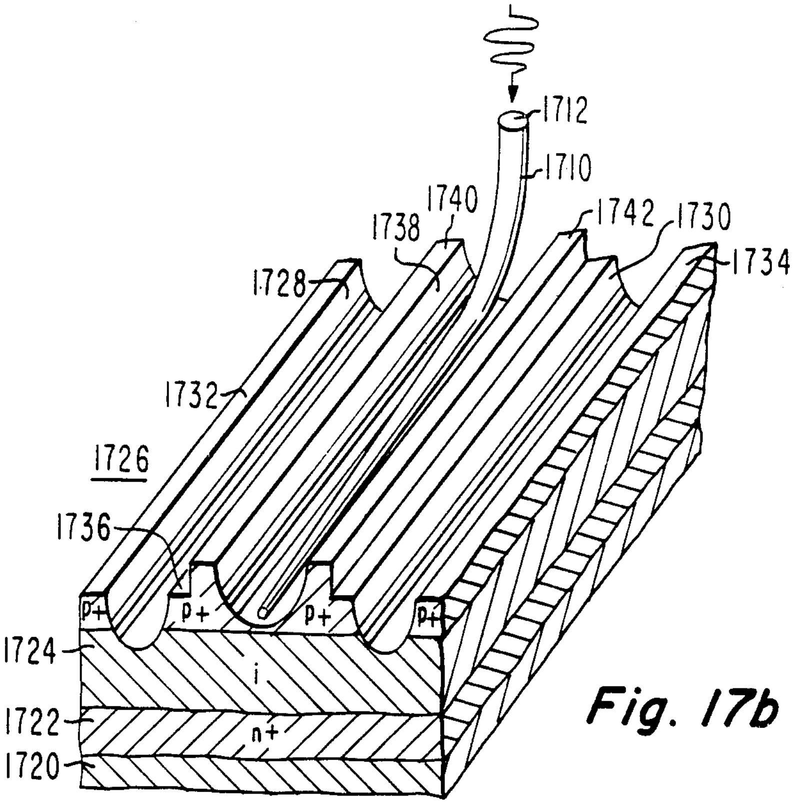
FIG. 17b illustrates an arrangement by which such a cable can control an elongated portion of an elongated vertically doped PIN junction.
Figure 17A:
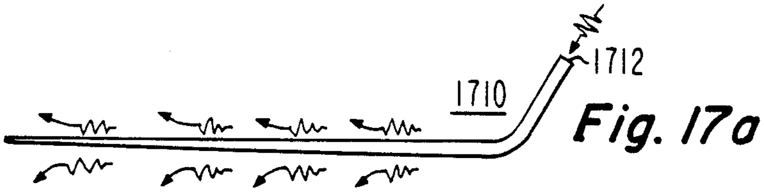
FIG. 17a illustrates a tapered fiber-optic cable which leaks light along its length.

FIG. 17*a* illustrates a tapered fiber-optic cable 1710. Such a cable can be tapered by heating a central portion of the fiber, and pulling the two ends apart until the central portion is thin. When light is directed into a fiber-optic cable in the direction of decreasing diameter, the light leaks out of the cable along its length, as suggested in FIG. 17*a*. FIG. 17*b* illustrates a vertically doped distributed PIN junction including bottom metallization 1720, n+ region 1722, intrinsic region 1724, and a p+ layer designated generally as 1726 divided by first and second moats 1728 and 1730 into two outlying nonactive p+ regions 1732 and 1734, and a central active p+ region 1736. Region 1736 is traversed by a valley 1738 which extends almost down to the layer 1724. Conductive regions 1740, 1742 overlie the two portions of p+ regions, 1736 which are separated by valley 1738. Tapered fiber-optic cable 1710 lies in valley 1738 and is held in place by a small amount of adhesive or epoxy. Light coupled into large end 1712 of the tapered fiber-optic cable leaks out of the cable at locations distributed along the bottom of valley 1738, which is immediately adjacent to the junction between p+ and the intrinsic regions. Thus, the junction is continuously or evenly illuminated.

Figure 18:
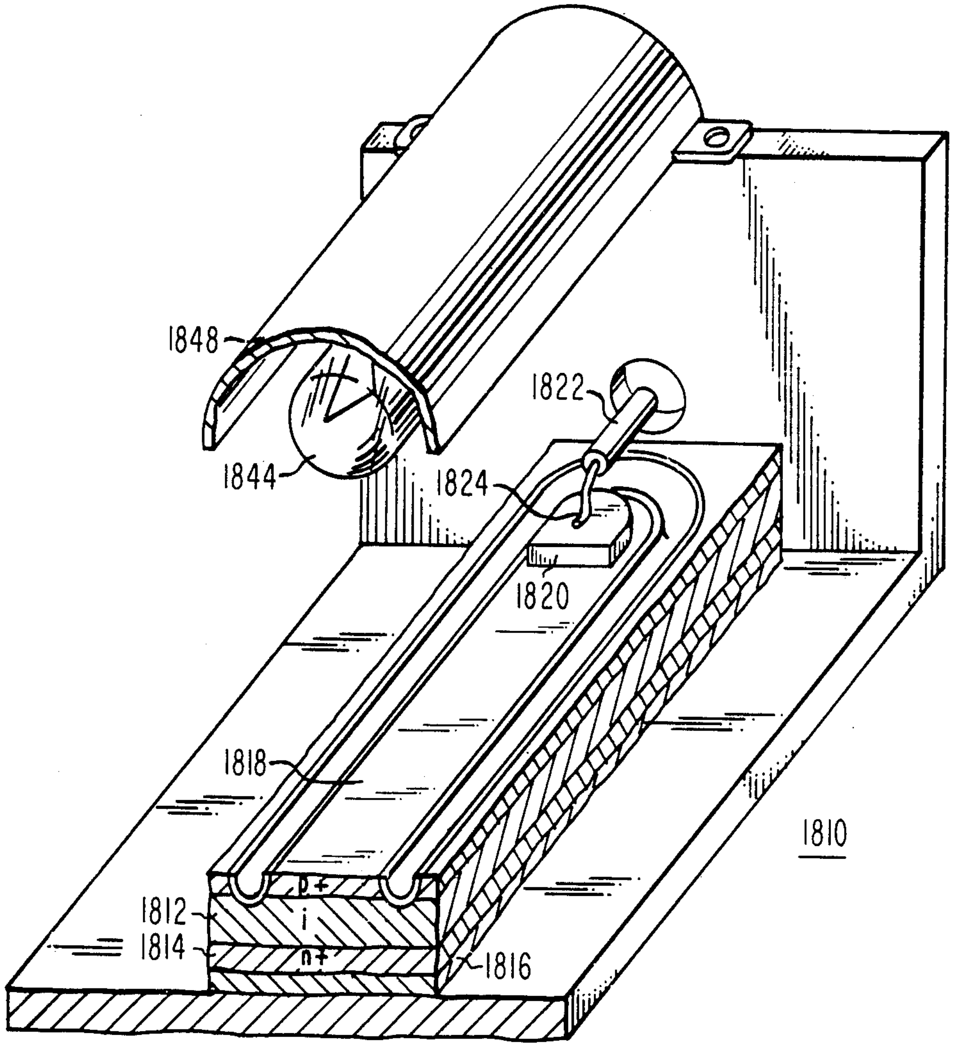
FIG. 18 illustrates a phase shifter in which phase shift is provided by an elongated vertically-doped PIN-diode which has metallization only near the ends to provide an area for ohmic contact for application of RF signals, with control by general illumination of the PIN junction.

FIG. 18 illustrates a distributed phase shifter 1810 including n+ region 1814, intrinsic region 1812 and elongated p+ layer 1818. If p+ layer 1818 is highly conductive, the overlying metallization may be dispensed with except at the ends of the strip, where it is needed for ohmic contact. The p+ region acts both as a conductor and as a part of the PIN junction. Contact metallization 1820 overlies p+ layer 1818 only near connector pin 1822. A bonding wire 1824 connects pin 1822 to metallization 1820. The absence of metallization over the principal portion of the surface of p+ region 1818 allows transmission of more light from lamp 1844 to the PIN junction than does the presence of metallization.

Other embodiments of the invention will be apparent to those skilled in the art. For example, the optical control may include lenses for focussing light from a central light source onto the semiconductor junction. Junctions other than PIN diodes may be used, as for example simple PN diodes and Shottky-barrier (hot-carrier) diodes. The fiber-optic cable may enter or illuminate the semiconductor junction from the side rather than from the top or bottom. Any of a number of semiconductor materials may be used, rather than silicon, as for example Ge, GaAs, and the like. The fenestrations in a structure such as illustrated in FIG. 3 may be of shapes other than rectangular, and the spacing of the fenestrations will be determined by such factors as light coupling efficiency and impedance effects at the AC frequency of operation. The $S_iO_2$ passivation layer may be applied over windows, if desired. Any type of coaxial connector may be used rather than the type illustrated in FIG. 4, as for example standard type N or BNC. While control of phase-shift has been described in terms of control by means of a single light source, it is possible to use a plurality of light sources, such as a plurality of light-emitting diodes, each driving a separate fiber-optic cable. If desirable, the light intensity applied to certain portions of the phase-shifter may exceed that applied to other portions.

The light illuminating the junction may be of a single visible or invisible wavelength selected for maximum effect, or may include a plurality of wavelengths. Anti-reflective coatings can be used to maximize light transmission into the junction. If desired, light control may be augmented by electrical bias signals coupled to the junctions as described for example in copending patent application Ser. No. 706,752 filed Feb. 28, 1985 in the name of A. Rosen, and entitled "Distributed PIN Diode Phase Shifter". The frequency of the AC signal which is phase-shifted may be any frequency, but the structure is better adapted to microwave and millimeter (mm) wave frequencies than to very low frequencies.

What is claimed is:

1. A transmission line device for shifting the phase of AC electrical signals propagating therealong in response to light from a light source comprising:

a transmission line including separated first and second elongated conductors defining a structure having at least a distributed series inductance associated with said first and second conductors and also defining an input port and an output port;

at least one semiconductor junction having a capacitance associated with said junction, said semiconductor junction being coupled to said transmission line for coupling said capacitance across said first and second conductors for shifting the phase of said AC electrical signals; and light control means positioned relative to at least one said semiconductor junction, for, in response to said light, illuminating said junction for control of said capacitance whereby said delayed electrical signals are controllably delayed.

2. A phase shifter according to claim 1 wherein said semiconductor junction is distributed along a substantial portion of said transmission line.

3. A phase shifter according to claim 2 wherein said semiconductor junction is a PIN junction.

4. A phase shifter according to claim 2 wherein said first elongated conductor overlies said junction and defines at least one unmetallized window through which said illumination reaches said junction.

5. A phase shifter according to claim 4 wherein said light control means comprises:

a source of light; and reflector means arranged to reflect light from said source to illuminate said window.

6. A phase shifter according to claim 4 wherein said optical control means comprises:

a source of light; and fiber-optic coupling means coupled to said source of light and to said window for conveying light from said source of light for illuminating said junction.

7. A phase shifter according to claim 6 wherein said junction is a PIN junction including a heavily doped layer of semiconductor sandwiched between said metallization layer and a layer of intrinsic semiconductor.

8. A phase shifter according to claim 7 wherein said heavily doped layer of semiconductor defines a cavity adjacent said window for reducing the amount of said heavily doped semiconductor through which said illumination must pass before reaching said junction.

9. A phase shifter according to claim 2 wherein said junction includes layers of doped semiconductors defining elongated interface regions between said layers; and said light control means illuminates said junction from a direction which directs said illumination substantially parallel with at least one of said interface regions.

10. A phase shifter according to claim 9 wherein said light control means includes a fiber-optic cable.

11. A phase shifter according to claim 1 wherein said second conductor is a ground plane, said first conductor is a strip conductor separated from said ground plane by a flat sheet of dielectric material, and said semiconductor junction is a discrete junction having largest dimensions much smaller then the length of said strip conductor.

12. A phase shifter according to claim 11 wherein said discrete junction is a PIN diode.

13. A phase shifter according to claim 11 wherein said semiconductor junction is overlain by a layer of metallization which defines at least one fenestration, through which said illumination reaches said junction.

14. A phase shifter according to claim 13 wherein said light control means comprises:

a source of light; and reflector means arranged to reflect light from said source to said fenestration.

15. A phase shifter according to claim 13 wherein said light control means comprises:

a source of light; and fiber-optic coupling means coupled to said source of light and to said fenestration for conveying light from said source for illuminating said junction.

16. A phase shifter according to claim 15 wherein said junction is a PIN junction including a heavily doped layer of semiconductor sandwiched between said metallization layer and a layer of intrinsic semiconductor.

17. A phase shifter according to claim 16 wherein said heavily doped layer of semiconductor defines a cavity adjacent said fenestration for reducing the amount of said heavily doped semiconductor through which said illumination must pass before reaching said junction.

18. A phase shifter according to claim 11 further comprising a second discrete semiconductor junction having a capacitance, said second junction being coupled to said transmission line and to said light control means for of said capacitance.

19. An light controlled electrical phase shifter, comprising:

a substantially flat monolithic chip including a layer of N+ doped semiconductor overlaid by a layer of substantially intrinsic semiconductor, and an elongated strip of P+ doped semiconductor overlying a portion of said layer of substantially intrinsic semiconductor, thereby forming a laterally elongated vertically doped PIN junction;

a first metallization layer substantially overlying that side of said layer of N+ doped semiconductor remote from said layer of substantially intrinsic semiconductor, and a second metallization layer substantially overlying said elongated strip of P+ doped semiconductor to thereby form an elongated transmission line in which shunt capacitance is associated with said PIN junction; and light control means positioned relative to said PIN junction for controlling the characteristics of said PIN junction for controlling the parameters of said transmission line whereby the phase shift of an electrical signal transversing said transmission line is controlled.

20. A phase shifter according to claim 19 wherein said light control comprises a means for focusing light onto said PIN junction.

21. phase shifter according to claim 19 wherein said light control comprises a source of controlling illumination and an optical fiber coupled to said source of controlling illumination and to said PIN junction for conveying said illumination to said PIN junction.

22. A phase shifter according to claim 21 wherein said light fiber penetrates one of said layer of N+ doped semiconductor and said strip of P+ doped semiconductor to convey said controlling illumination to a point near the juncture of said substantially intrinsic layer and said one of said layer of N+ doped semiconductor and said strip of P+ doped semiconductor.

23. A distributed optically controlled semiconductor apparatus, comprising:

a laterally elongated semiconductor junction doped to form layers, thereby defining a first port at a first end of said laterally elongated semiconductor junction and a second port at a second end of said laterally elongated semiconductor junction;

a source of alternating-current electrical signals coupled to said first port for causing said alternating-current electrical signals to traverse said laterally elongated semiconductor junction to said second port;

utilization means coupled to said second port for receiving said alternating-current electrical signals after they have traversed said laterally elongated semiconductor junction;

a source of light at a wavelength selected to affect the characteristics of said laterally elongated semiconductor junction;

light coupling means coupled to said source of light and positioned relative to said laterally elongated semiconductor junction for coupling said light to said semiconductor junction, whereby if a single fiber-optic cable couples said light into said laterally elongated semiconductor juncton the characteristics of said laterally elongated semiconductor junction may be affected only in that relatively small portion of said laterally elongated semiconductor junction subtended by the cone of light from said fiber-optic cable thereby undesirably reducing the range of possible control;

whereby said light coupling means further comprises:

light splitting means coupled to said source of light for splitting said light into a plurality of portions;

fiber-optic coupling means including a plurality of fiber-optic cables each of which is coupled to said light splitting means and to said laterally elongated semiconductor junction for coupling each of said plurality of portions of light to substantially adjacent locations along said laterally elongated semiconductor junction for providing substantially continuous illumination along at least a portion of each of said laterally elongated semiconductor junction thereby increasing said range of possible control.

24. Apparatus according to claim 23 wherein said light means is an optical star.

25. Apparatus according to claim 23, wherein said laterally elongated semiconductor junction is laterally elongated PIN junction.

26. Apparatus according to claim 25 wherein said light splitting means is an optical star.

27. Apparatus according to claim 25 wherein each of said plurality of fiber-optic cables penetrates substantially into at least one of said p and n layers of said PIN junction in order to couple light more effectively to the active portion of said PIN junction.

28. Apparatus according to claim 27 wherein at said layers are vertically stacked, and at least some of said plurality of fiber-optic cables are oriented to direct light parallel to said vertically stacked layers.

29. A light controlled phase shifter, comprising:

a transmission line including first and second elongated separated conductors defining a structure having at least a distributed series inductance associated with said first and second conductors and also defining an input port and an output port;

at least one semiconductor junction having a capacitance associated with said junction, said semiconductor junction being coupled to said transmission line for coupling said capacitance across said first and second conductors;

coupling means coupled to said input port for coupling alternating-current electrical signals to said input port whereby said electrical signals propagate through said transmission line to said output port and appear at said output port as delayed electrical signals;

utilization means coupled to said output port for receiving said delayed electrical signals; and light control means coupled to at least one said semiconductor junction for selective illumination thereof for control of said capacitance whereby said delayed electrical signals are controllably delayed.

30. A phase shifter for alternating electrical signals, comprising:

a transmission line including a pair of elongated separate conductors with which a distributed shunt capacitance is associated and along which said alternating electrical signals propagate;

a semiconductor junction having capacitance associated therewith coupled across said conductors; and light means positioned relative to the said junction to illuminate said junction whereby said electrical signals are phase-shifted in response to light.

* * * * *